United States Patent
Shetty et al.

(10) Patent No.: US 12,276,044 B2
(45) Date of Patent: Apr. 15, 2025

(54) LOW ETCH PIT DENSITY GALLIUM ARSENIDE CRYSTALS WITH BORON DOPANT

(71) Applicant: AXT, Inc., Fremont, CA (US)

(72) Inventors: Rajaram Shetty, Niskayuna, NY (US); Weiguo Liu, San Leandro, CA (US); Morris Young, Fremont, CA (US)

(73) Assignee: AXT, Inc., Fremont, CA (US)

( * ) Notice: Subject to any disclaimer, the term of this patent is extended or adjusted under 35 U.S.C. 154(b) by 327 days.

(21) Appl. No.: 16/711,882

(22) Filed: Dec. 12, 2019

(65) Prior Publication Data

US 2020/0190697 A1 Jun. 18, 2020

Related U.S. Application Data

(60) Provisional application No. 62/779,036, filed on Dec. 13, 2018.

(51) Int. Cl.
*C30B 29/42* (2006.01)
*C30B 11/00* (2006.01)
(Continued)

(52) U.S. Cl.
CPC ............ *C30B 29/42* (2013.01); *C30B 11/002* (2013.01); *C30B 11/006* (2013.01);
(Continued)

(58) Field of Classification Search
None
See application file for complete search history.

(56) References Cited

U.S. PATENT DOCUMENTS

| 6,890,804 B1* | 5/2005 | Shibib | H01L 29/41741 257/E29.279 |
| 2012/0083118 A1* | 4/2012 | Luu | H01L 21/67253 438/660 |

(Continued)

OTHER PUBLICATIONS

Sturge, "Optical Absorption of Gallium Arsenide between 0.6 and 2.75 eV", 1962, PhysRev. 127.768 (Year: 1962).*
(Continued)

*Primary Examiner* — Xiaoming Liu
(74) *Attorney, Agent, or Firm* — McAndrews, Held & Malloy, Ltd.

(57) ABSTRACT

Methods and systems for low etch pit density gallium arsenide crystals with boron dopant may include a gallium arsenide single crystal wafer having boron as a dopant, an etch pit density of less than 500 cm$^{-2}$, and optical absorption of 6 cm$^{-1}$ or less at 940 nm. The wafer may have an etch pit density of less than 200 cm$^{-2}$. The wafer may have a diameter of 6 inches or greater. The wafer may have a boron concentration between $1\times10^{19}$ cm$^{-3}$ and $2\times10^{19}$ cm$^{-3}$. The wafer may have a thickness of 300 μm or greater. Optoelectronic devices may be formed on a first surface of the wafer, which may be diced into a plurality of die and optical signals from an optoelectronic device on one side of one of the die may be communicated out a second side of the die opposite to the one side.

11 Claims, 4 Drawing Sheets

(51) Int. Cl.
H01L 29/207 (2006.01)
H01L 29/32 (2006.01)
H01L 29/36 (2006.01)

(52) U.S. Cl.
CPC ............ H01L 29/207 (2013.01); H01L 29/32 (2013.01); H01L 29/36 (2013.01)

(56) References Cited

U.S. PATENT DOCUMENTS

2017/0051883 A1* 2/2017 Raring .................. H01S 5/2201
2019/0264348 A1* 8/2019 Fukunaga ............... C30B 27/00

OTHER PUBLICATIONS

Kamp et al. "Te doping of GaAs using Dilthyl-tellurium" J. Appl. Phys. 76 (3), Aug. 1, 1994 (Year: 1994).*

* cited by examiner

LOW ETCH PIT DENSITY GALLIUM ARSENIDE CRYSTALS WITH BORON DOPANT

CROSS-REFERENCE TO RELATED APPLICATIONS/INCORPORATION BY REFERENCE

This application claims priority to and the benefit of U.S. Provisional Application No. 62/779,036 filed on Dec. 13, 2018, which is hereby incorporated herein by reference in its entirety.

FIELD

Certain embodiments of the disclosure relate to semiconductor substrates. More specifically, certain embodiments of the disclosure relate to low etch pit density gallium arsenide crystals with boron dopant.

BACKGROUND

Semiconductor substrates, and specifically Group III-V semiconductor substrates, are used in the manufacture of electronic and optoelectronic devices such as heterojunction bipolar transistors (HBTs), pseudo-morphic high-electron mobility transistors (pHEMTs), and lasers, for example. Defects in the substrates can reduce yields and increase costs.

Further limitations and disadvantages of conventional and traditional approaches will become apparent to one of skill in the art, through comparison of such systems with the present disclosure as set forth in the remainder of the present application with reference to the drawings.

BRIEF SUMMARY

A system and/or method for low etch pit density gallium arsenide crystals with boron dopant, substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION

Certain aspects of the disclosure may be found in a method and wafers for low etch pit density gallium arsenide crystals with boron dopant.

Figure 1:
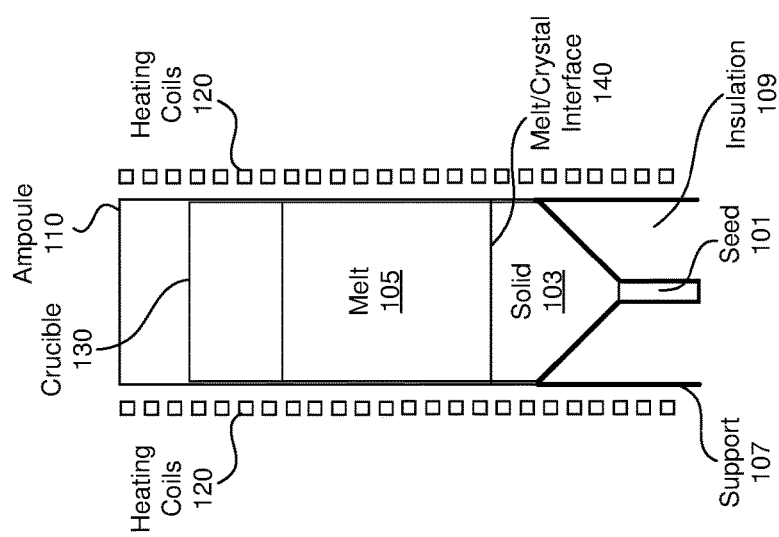
FIG. 1 is a diagram illustrating a vertical gradient freeze reactor, in accordance with an example embodiment of the disclosure.

FIG. 1 is a diagram illustrating a vertical gradient freeze reactor, in accordance with an example embodiment of the disclosure. Referring to FIG. 1, there is shown vertical gradient freeze (VGF) system 100 comprising an ampoule 110, a support 107, heating coils 120, and a crucible 130. Within the ampoule 110, growth may proceed using a seed crystal 101 and a liquid melt 105 in a vertical configuration, where the solid 103 forms due to very gradual cooling of the melt 105. The crucible 130 may comprise pyrolytic boron nitride (PBN), for example, and may contain the melt and seed materials during the process.

The VGF system 100 comprises a configuration for growth charge, heater, insulation and support that includes: direct radiation from heating coils 120 above the level of cone in the crystal growth charge, the seed 101, and may also comprise a support structure 107 for support of the ampoule 110 in the heating coils 120. In addition, insulation 109 may be placed within the support 107 to promote radial heat flux inward during growth and heat removal during post-growth process and cooling. The support cylinder 107 for the growth ampoule 110 may comprise a hollow core below the seed pocket holding the seed crystal 101 to provide a conducting heat flow path downward through the center and further aided and made more stable by a larger diameter quartz rod down to the bottom of the heater.

In the VGF process, a polycrystal charge, the seed 101, in crucible 130 in the ampoule 110 may be heated with a multi-zone furnace, as represented by the heating coils 120. Crystal growth is initiated by melting the charge to the seed 101, thereby forming the melt 105, and slowly reducing the temperature to cool the melt 105 at the seed 101. The crystallization process, forming the solid 103, may be precisely controlled by varying the temperature grading in different zones of the furnace, such as by applying different currents to different portions of the heating coils 120. Accordingly, the heating coils 120 may comprise a multi-zone heating system where different temperatures, heating/cooling rates, and spatial temperature profiles are enabled.

The VGF process has several advantages over other processes such as liquid encapsulated Czochralski (LEC) and horizontal Bridgman (HB). First, the thermal environment of the crystal and melt are radially symmetric, enabling a radially uniform interface and precise control of temperature profiles. Second, growth in low axial and radial temperature gradients, combined with diameter control imposed by a crucible, and no need to use a large temperature gradient to freeze the crystal quickly, significantly reduces the strain and, hence, dislocations in the crystals. Third, the liquid-solid interface progresses upward through the melt, with crystallization starting at the seed 101 in the bottom of the crucible. The system is cooler at the bottom, and is thermally stabilized against convection. Even in the cooling process, easily adjustable cooling brings the crystal to room temperature at a rate that minimizes GaAs crystals that are not n- or p-type with an average dislocation density of 1000 $cm^{-2}$ or less in 6" or greater diameter wafers have not been manufactured previously. Conventional GaAs wafers doped with silicon may have low EPD due to solution hardening effect when doped high enough, but this causes large infrared absorption. In an example embodiment of the present disclosure, boron may be used as a dopant, added into pure GaAs crystal, which achieves a very low dislocation density effect in the VGF process when performed with specific growth controls. In an example scenario, no silicon doping is utilized so as to increase infrared transparency of the substrate, although small amounts may be present, codoped with boron.

Before crystal growth, the GaAs polycrystal containing boron is prefabricated by poly synthesis. The poly synthesis process, which may be performed in a quartz reactor tube utilizing a boat method, can ensure boron is incorporated into the GaAs crystal evenly, which enables the crystal growth process to admit the dopant. Once the polycrystalline GaAs is generated, VGF crystal growth may proceed. To achieve low EPD, several VGF parameters are carefully controlled. The first parameter may include the shape of the melt/crystal interface 140, which may be controlled to be concave to the melt, for example, being 10 mm concave with the center being ~10 mm lower than the edge of the 6" diameter crystal. This may be controlled with different temporal and/or spatial temperature profiles.

Second, the crystallization velocity as controlled by the cooling rate may be configured to a range from 0.2-0.5 degrees C./hour. Different solidification rates at different parts of the ingot may be configured. The temperature gradient along the growing crystal can create stress in the boule, where the head cools earlier and in some instances could have the head ~100 degrees cooler than the tail, so precise control is desirable.

Finally, the temperature gradient at the melt/crystal interface may be configured to be between 4-8 degree C./cm. Again, multi-zone heating may enable precise control of the temperature throughout the crucible 130. After completing the overall solidification, the temperature of the heating may be lowered to room temperature at the speed of about 0.5-5 degrees C./hour, 1-20 degrees C./hour, and 5-20 degrees C./hour, in different heating zones, respectively. This process results in a low-dislocation 6 inch diameter GaAs single crystal of about 85 mm in length, with a cylindrical body portion. While the process is described for 6" diameter ingots, the same process may be used for other diameters, with different furnace size. The dislocation density resulting from this process is less than 500 $cm^{-2}$, less than 200 $cm^{-2}$, and even less than 100 $cm^{-2}$, as shown in FIG. 2.

Figure 2:
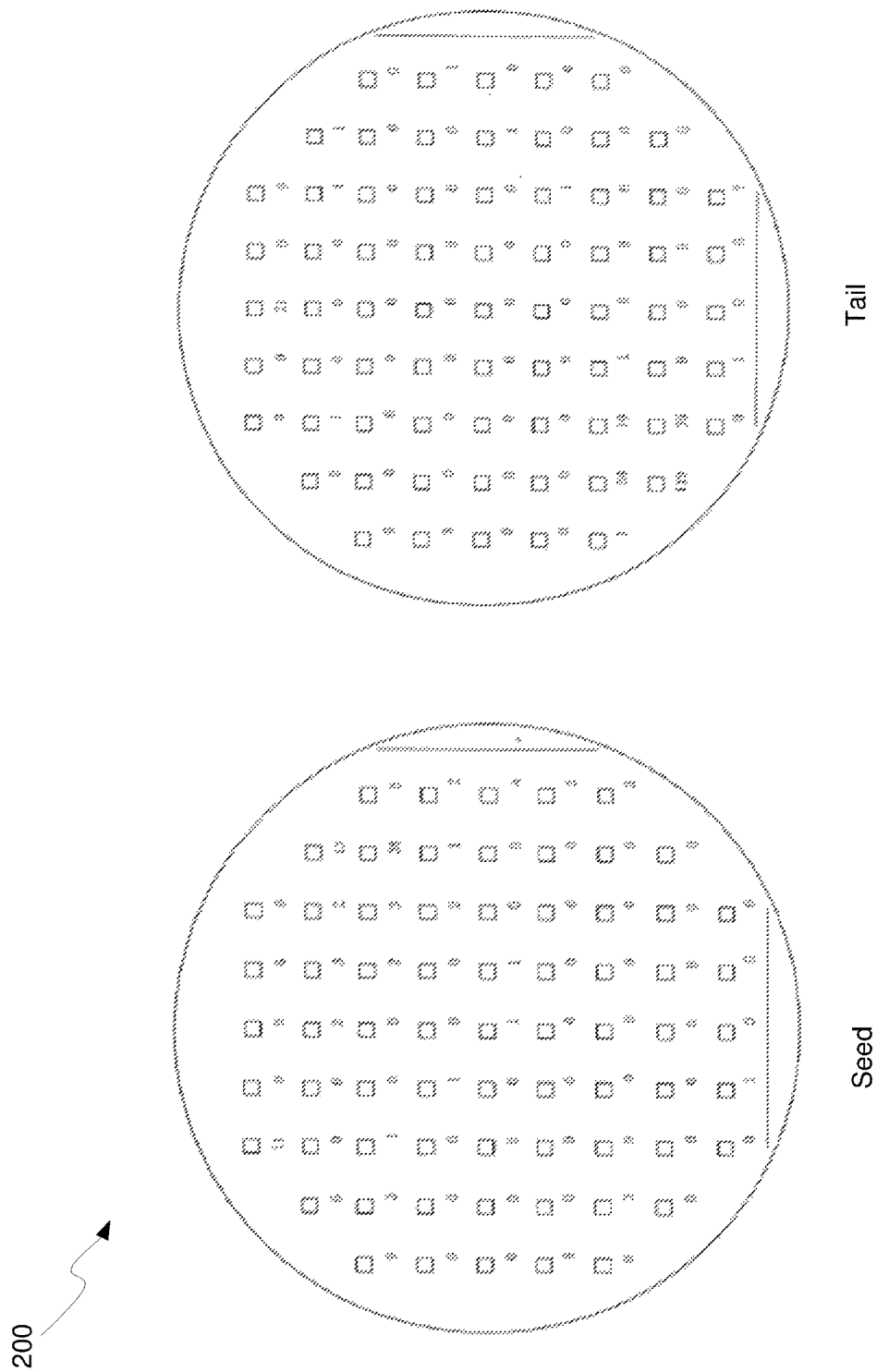
FIG. 2 illustrates etch pit density results for 6" gallium arsenide wafers manufactured in accordance with an embodiment of the disclosure.

FIG. 2 illustrates etch pit density results for 6" gallium arsenide wafers manufactured in accordance with an embodiment of the disclosure. Referring to FIG. 2, the EPD measurements are performed in accordance with SEMI M36-0699 and ASTM Test Method F140-92. An example of the EPD level as measured at 69 points (each point having an area of 0.024 $cm^2$) is shown in FIG. 2, with results for the seed and tail ends of the crystal.

Wafers from different ingots were measured and show an average EPD of 50 and 75/$cm^2$ and the maximum EPD is 875 and 1583/$cm^2$ for wafers at the crystal seed end of the two ingots and an average EPD of 156 and 164/$cm^2$ with maximum EPD of 3125 and 4958/$cm^2$ for wafers at the tail end of the two ingots. This is significantly improved over existing GaAs substrates.

Table 1 shows absorption coefficient data for GaAs substrates.

| Dopant | Thickness (μm) | Absorption Coefficient (1/cm) |
| --- | --- | --- |
| B | 692 | 5.340 |
| B | 693 | 5.337 |
| B | 693 | 3.823 |
| B | 694 | 4.585 |
| Si | 577 | 10.219 |
| Si | 578 | 9.040 |
| Si | 580 | 7.057 |
| Si | 581 | 11.113 |

Table 1 shows the absorption data for wafers from ingots produced by the process described in this disclosure. The absorption coefficient values measured at a wavelength of 940 nm for wafers from the two ends of the ingot with a nominal thickness of ~600 μm. The wafers may range from 300 μm to 1000 μm, for example. For the boron doped wafers, the absorption coefficients are all <6 $cm^{-1}$. This value is much lower than the typical Si-doped GaAs wafers which may have absorption coefficients in the range of ~7.0-11.0 $cm^{-1}$ as shown by the data shown above for silicon-doped wafers using a similar measurement at 940 nm. At 1000 nm and 1050 nm, boron doped wafers show absorption coefficients of <2 $cm^{-1}$.

The growth of very low EPD, low absorption B-doped GaAs wafers by the VGF process can result in high device yields and may be extremely useful in design and manufacture of vertical emitting structures such as LEDs and VCSELs (Vertical Cavity Surface Emitting Lasers) that use flip-chip technology. The VGF process described above yields very low EPD, low absorption wafers of 6 inches in diameter or greater.

Figure 3:
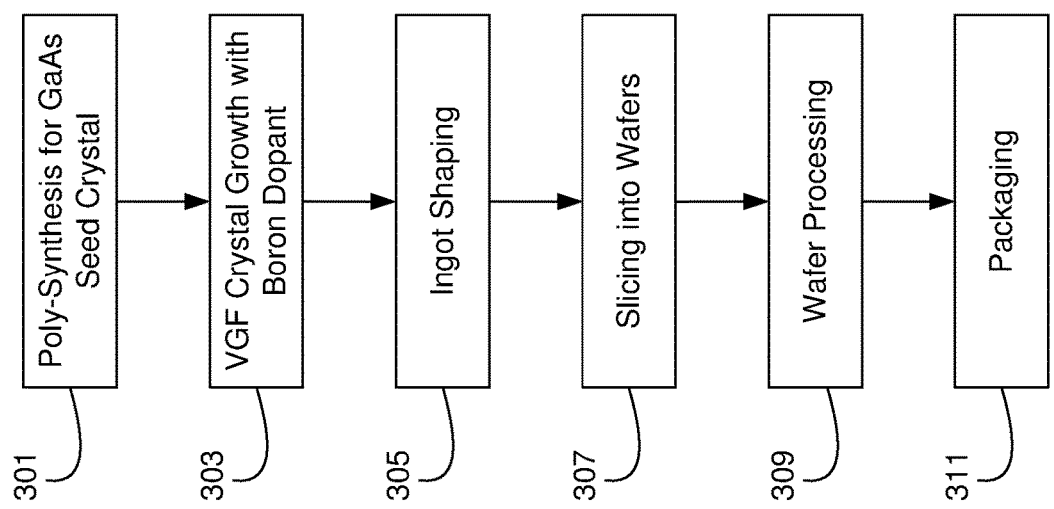
FIG. 3 illustrates a flow chart for fabricating gallium arsenide wafers using a vertical gradient freeze process, in accordance with an example embodiment of the disclosure.

FIG. 3 illustrates a method for fabricating GaAs wafers using the vertical gradient freeze furnace 100 shown in FIG. 1. The process results in 6 inch GaAs substrates with less than 500 $cm^{-2}$ etch pit density, and can result in less than 100 $cm^{-2}$ average etch pit density and <6 $cm^{-1}$ absorption coefficient at 940 nm. This process may also be used to fabricate indium phosphide (InP), gallium phosphide (GaP) or other related III-V compound semiconductors.

In step 301, raw arsenic (As), gallium (Ga) and boron (B) may be obtained and testing may be performed on the raw materials before being placed in a boat in a quartz tube for poly synthesis to produce B-doped polycrystalline GaAs. This process comprises preparing a charge with a crucible containing polycrystalline GaAs with boron prefabricated by poly-synthesis, a seed crystal, appropriate amount of $B_2O_3$ encapsulant, appropriate amount of carbon dopant, evacuating and sealing the crucible inside a fused quartz ampoule.

Once the polycrystalline GaAs is generated, vertical gradient freeze (VGF) crystal growth occurs in step 303 where the ampoule with the crucible is heated inside a multizone heating system in a controlled manner to progressively melt the polycrystalline charge material containing boron from the top down until a portion of the seed crystal is melted. Growth may be started from the partially melted seed by implementing a controlled cooling of the multi-zone heater. The temporal and spatial temperature profiles are closely controlled to result in less than 500 $cm^{-2}$ on 6 inch or greater diameter crystals.

To achieve low EPD, several VGF parameters are carefully controlled. The first parameter may include the shape of the melt/crystal interface, which may be controlled to be concave to the melt, for example, being 10 mm concave with the center being ~10 mm lower than the edge of the 6" diameter solidified crystal. This may be controlled with different temporal and/or spatial temperature profiles. Second, the crystallization velocity as controlled by the cooling rate may be configured to range from 0.1-2 degrees C./hour for different parts of the ingot, while applying a temperature gradient of between 1 and 8 C/cm at the melt-crystal interface. The interface shape may be controlled to be slightly concave to the melt by using appropriate cooling rates in the multi-zone heating system. Different solidification rates at different parts of the ingot may be configured. Finally, the temperature gradient at the melt/crystal interface may be configured to be between 4-8 degree C./cm. Following completion of solidification of the charge material, applying a controlled cooling with appropriate cooling rates of 0.5-5 C/h, 1-10 C/h and 5-20 C/h for different heating zones for the first 300 C, and then at rates of 20-50 C/h to room temperature may result in very low defect density crystal.

Once the VGF crystals are grown (and optionally tested), in step 305, an ingot shaping process may be conducted to result in a rounded ingot with desired flats, for example, and may also be tested. Once the ingot is shaped, the ingot may be sliced into wafers in step 307, and the wafers may be optionally tested.

Once the low EPD wafers have been sliced from the ingot, the wafers may proceed to wafer processing step 309. An optional wafer annealing process may be performed. In an example annealing process, one or more annealing stages may be used, where the wafers may be loaded vertically into a horizontal quartz boat and inserted in a horizontal quartz ampoule along with arsenic lumps. The arsenic lumps may be configured to provide the needed vapor pressure at the annealing temperature to avoid any arsenic dissociation from the GaAs substrates. The ampoule is then pumped down to a high vacuum level ($<5E^{-3}$ Torr) and sealed. The ampoule and its contents may then be inserted into a horizontal 3-zone furnace, for example, and the heating of the ampoule and its contents to the desired set (platform) temperature is initiated.

Testing may be performed on the wafers to ensure structural and electrical quality. In an example scenario, the boron concentration in the entire ingot may be greater than $1\times10^{19}$ $cm^{-3}$, in some embodiments within the range of $1.0\times10^{19}$ $cm^{-3}$ to $2\times10^{19}$ $cm^{-3}$, and with a boron ratio of 1:1 to 1:3 from one end of the ingot to the other end, or 1:1 to 1:1.5 in a more uniform ingot. Structural quality may be assessed by x-ray characterization and etch pit density measurements. Average dislocation etch pit density (EPD) of less than 500/$cm^2$, less than 200 $cm^{-2}$, and even less than 100 $cm^{-2}$, may result using the above-described process. Structural and electrical quality may also be assessed by optical absorption measurements, where an absorption coefficient of $<6$ $cm^{-1}$ or less at 940 nm may result.

Once the low EPD wafers are annealed and optionally tested, a wafer polishing process may be performed that polishes the low EPD wafers and the polished wafers may again be optionally tested. Once the wafers are polished, they may be cleaned and then proceed to step 311 where they may be packaged for shipping to customers. The above processes may also be used to produce indium phosphide (InP) or other compound semiconductor wafers. As a result of this process, low EPD 6 inch GaAs wafers are produced.

Figure 4:
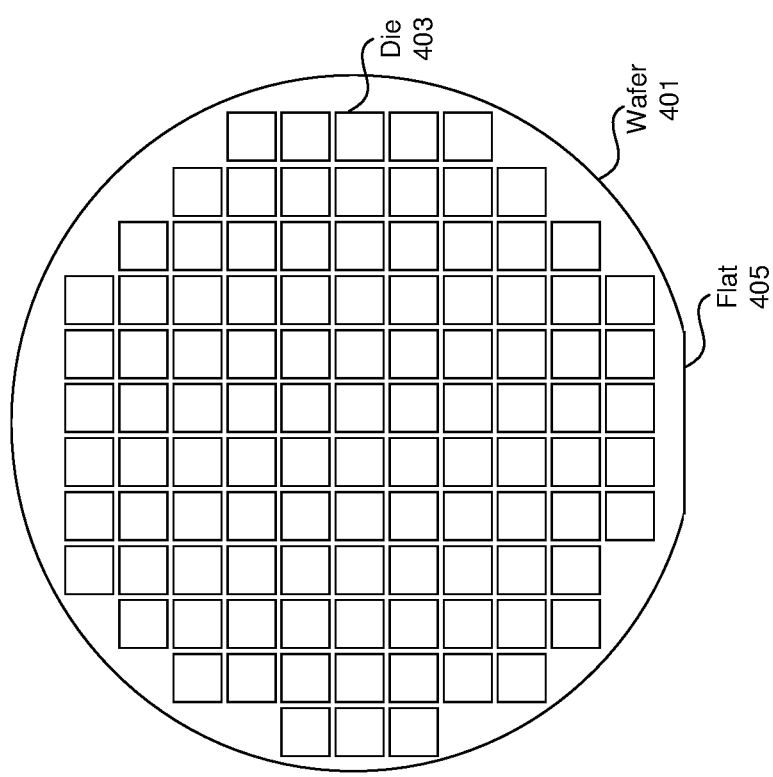
FIG. 4 illustrates devices fabricated on low etch pit density 6 inch semi-insulating gallium arsenide wafers, in accordance with an example embodiment of the disclosure.

FIG. 4 illustrates devices fabricated on low etch pit density low absorption 6 inch gallium arsenide wafers, in accordance with an example embodiment of the disclosure. Referring to FIG. 4, there is shown a 6 inch GaAs wafer 401 manufactured using the process described above, and further processed with electrical and/or optoelectronic devices on the die 403. There is also shown a flat 405, which may be formed in wafer fabrication to indicate a crystal plane, for example. The number of die 403 on the wafer 401 may be defined by the area of each die and the size shown in FIG. 4 is merely an example.

In addition, the die 403 may comprise optoelectronic devices such as edge-emitting lasers, vertical cavity surface-emitting lasers (VCSELS), and photodetectors where it may be desired to communicate optical signals through the wafer 401. For example, an array of detectors or surface emitting lasers may be formed on the wafer 401 and readout or control circuitry may be placed on the devices while the optical signals are received and/or transmitted through the wafer 401. Low absorption of optical signals, such as the $<5$ $cm^{-1}$ at 940 nm or $<2$ $cm^{-1}$ at 1000 nm described here allow for such infrared applications.

The process described above may be utilized to generate semi-insulating, low-doped substrates, and/or doped substrates. Semi-insulating GaAs substrates enable high-speed electronic devices due to the high resistivity of the substrates, where conductive substrates can cause losses and parasitic capacitance. Example devices include pseudomorphic high electron mobility transistors (pHEMTs) and heterojunction bipolar transistors. Dislocations in the substrate can reduce reliability of the devices as current can increase defect size, for example. Furthermore, the resulting wafers have low enough absorption 6 $cm^{-1}$ or less at 940 nm, optical and optoelectronic devices may be formed on the wafers with optical signals travelling through the wafer with minimal losses.

In an embodiment of the disclosure, wafers for low etch pit density gallium arsenide crystals with boron dopant may include a gallium arsenide single crystal wafer having boron as a dopant, an etch pit density of less than 500 $cm^{-2}$, and optical absorption of 6 $cm^{-1}$ or less at 940 nm. The wafer may have an etch pit density of less than 200 $cm^{-2}$. The wafer may have a diameter of 6 inches or greater. The wafer may have a boron concentration greater than $1\times10^{19}$ $cm^{-3}$, or in some embodiments between $1\times10^{19}$ $cm^{-3}$ and $3\times10^{19}$ $cm^{-3}$. The wafer may have a thickness of 300 μm or greater. Optoelectronic devices may be formed on a first surface of the wafer, which may be diced into a plurality of die and optical signals from an optoelectronic device on one side of one of the die may be communicated out a second side of the die opposite to the one side.

In another embodiment of the disclosure, a method for low etch pit density gallium arsenide crystals with boron dopant may include sealing charge material comprising polycrystalline gallium arsenide seed crystal, $B_2O_3$ encapsulant, and carbon in a crucible; sealing the crucible in a quartz ampoule; performing a vertical gradient freeze crystal growth process by heating the ampoule using a multi-zone heating system to progressively melt the charge material until a portion of the seed crystal is melted; starting growth from the partially melted seed by implementing a controlled cooling of the multi-zone heating system; applying a temperature gradient of between 1 and 8 C/cm at a melt-crystal interface; and controlling a shape of the interface to be concave to the melt utilizing cooling rates in the multi-zone heating system to form a solidified gallium arsenide crystal.

The cooling of the multi-zone heating system may be configured at the rate of 0.1-2 C/h. The crucible may be evacuated before sealing it into the quartz ampoule. The solidified charge material may be cooled at rates of 0.5-5 C/h, 1-10 C/h, and 5-20 C/h for different heating zones for the first 300 C, and then at rates of 20-50 C/h to room temperature. The interface shape may be controlled to be concave to the melt, with the center being ~10 mm lower than the edge of the solidified crystal. The solidified crystal may have a diameter of 6 inches or more and may have an etch pit density of 500 $cm^{-2}$ or less. The solidified crystal may have a boron concentration greater than $1\times10^{19}$ $cm^{-3}$, and in some embodiments within the range of $1\times10^{19}$ $cm^{-3}$ and $2\times10^{19}$ $cm^{-3}$. The solidified crystal may comprise an ingot, and a boron concentration in the ingot may be greater than $1\times10^{19}$ $cm^{-3}$, and in some embodiments within the range of $1\times10^{19}$ cm$^{-3}$ and $3\times10^{19}$ cm$^{-3}$, and with a boron ratio of 1:1 to 1:1.5 from one end of the ingot to the other end.

While the invention has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A gallium arsenide single crystal wafer having a boron as a dopant, an average etch pit density of less than 500 cm$^{-2}$, and optical absorption of 6 cm$^{-1}$ or less at 940 nm, wherein the wafer does not have an intentional dopant other than boron, including silicon.

2. The wafer according to claim 1, wherein the wafer has an etch pit density of less than 200 cm$^{-2}$.

3. The wafer according to claim 1, wherein the wafer has an etch pit density of less than 100 cm$^{-2}$.

4. The wafer according to claim 1, wherein the wafer has a diameter of 6 inches or greater.

5. The wafer according to claim 1, wherein the wafer has a boron concentration between $1\times10^{19}$ cm$^{-3}$ and $2\times10^{19}$ cm$^{-3}$.

6. The wafer according to claim 1, wherein the wafer has a thickness of 300 μm or greater.

7. The wafer according to claim 1, wherein electronic and/or optoelectronic devices are formed on a first surface of the wafer.

8. The wafer according to claim 7, wherein the wafer is diced into a plurality of die and optical signals from an optoelectronic device on one side of one of the die are communicated out a second side of the die opposite to the one side.

9. A semiconductor substrate, the substrate comprising:
a gallium arsenide single crystal wafer having boron as a dopant, an etch pit density ranging from 50 cm$^{-2}$ to 5000 cm$^{-2}$ across the wafer, with an average etch pit density of less than 500 cm$^{-2}$, a boron concentration between $1\times10^{19}$ cm$^{-3}$ and up to $3\times10^{19}$ cm$^{-3}$, and optical absorption of 6 cm$^{-1}$ or less at 940 nm,
wherein the wafer does not have an intentional dopant other than boron, including silicon.

10. The semiconductor substrate according to claim 9, wherein the semiconductor substrate has a diameter of 6 inches or greater.

11. The semiconductor substrate according to claim 9, wherein the semiconductor substrate has a thickness of 300 μm or greater.

* * * * *